United States Patent
Hung (10) Patent No.: US 10,163,732 B2
(45) Date of Patent: Dec. 25, 2018

(54) MOVING PYROMETER FOR USE WITH A SUBSTRATE CHAMBER

(71) Applicant: Taiwan Semiconductor Manufacturing Company, Ltd., Hsin-Chu (TW)

(72) Inventor: Shih-Wei Hung, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/928,422

(22) Filed: Oct. 30, 2015

(65) Prior Publication Data

US 2017/0125308 A1    May 4, 2017

(51) Int. Cl.

| | |
|---|---|
| *H01L 21/00* | (2006.01) |
| *H01L 21/66* | (2006.01) |
| *G01K 13/00* | (2006.01) |
| *H01L 21/324* | (2006.01) |
| *G01J 5/04* | (2006.01) |
| *H01L 21/67* | (2006.01) |

(52) U.S. Cl.
CPC .............. *H01L 22/12* (2013.01); *G01J 5/04* (2013.01); *G01K 13/00* (2013.01); *H01L 21/3247* (2013.01); *H01L 21/67115* (2013.01); *H01L 21/67248* (2013.01); *H01L 22/26* (2013.01)

(58) Field of Classification Search
CPC ........ G01K 13/00; G01K 13/04; G01K 13/06; G01K 13/08
See application file for complete search history.

(56) References Cited

U.S. PATENT DOCUMENTS

| | | | |
|---|---|---|---|
| 6,455,814 B1 | 9/2002 | Samoilov et al. | |
| 2009/0155028 A1* | 6/2009 | Boguslavskiy | ..... C23C 16/4581 414/223.01 |
| 2011/0033610 A1* | 2/2011 | Bertram, Jr. | ............ C23C 16/44 427/8 |
| 2013/0130184 A1 | 5/2013 | Lu et al. | |
| 2013/0167769 A1* | 7/2013 | Shamoun | ................ C30B 25/10 117/86 |
| 2013/0343426 A1* | 12/2013 | Gurary | ...................... G01J 5/02 374/121 |
| 2014/0265101 A1* | 9/2014 | Pan | ................... H01L 21/68735 269/302 |
| 2016/0161343 A1* | 6/2016 | Smith | ............... B01L 3/502792 374/185 |

* cited by examiner

*Primary Examiner* — Mounir Amer
*Assistant Examiner* — Alexander Belousov
(74) *Attorney, Agent, or Firm* — Slater Matsil, LLP (57) ABSTRACT

A substrate processing chamber, having a processing surface, includes a guide fixed in place relative to the substrate processing chamber and a movable pyrometer connected to the guide. The movable pyrometer is movable along a radial axis that extends approximately between a center of the processing surface and an outer surface of the processing surface. The movable pyrometer is operable to monitor temperatures inside the substrate processing chamber along the radial axis.

21 Claims, 4 Drawing Sheets

MOVING PYROMETER FOR USE WITH A SUBSTRATE CHAMBER

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques of semiconductor dies.

The reduction in feature size in semiconductor devices has increased the need for precise processing. One aspect subject to precise processing is uniformity within a film. As a film is grown, the uniformity in thickness across the film generally depends heavily on the uniformity of temperature applied to the film. Temperature uniformity may be achieved by measuring film temperatures and controlling the applied temperature according to the measurements. Pyrometers are often used to measure temperatures of films in a semiconductor processing chamber.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
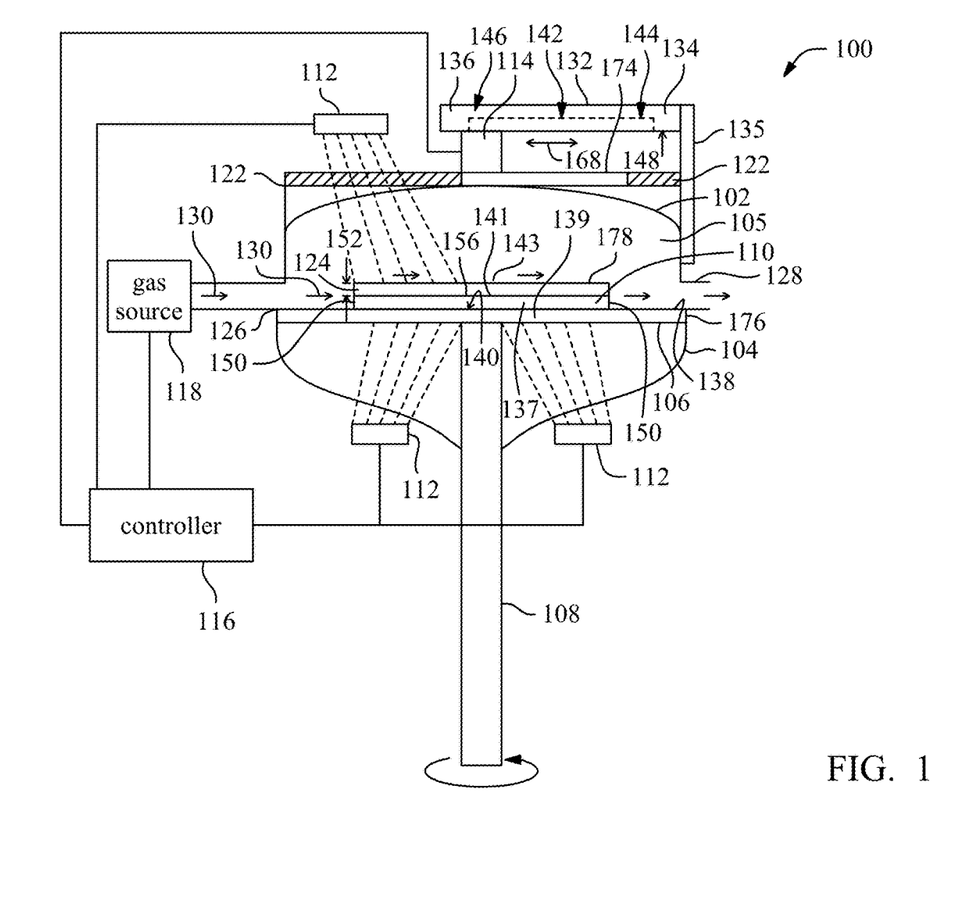
FIG. 1 is a schematic view, with a portion shown in cross-section, of a substrate processing chamber with a movable temperature sensor in accordance with some embodiments.

Referring initially to FIG. 1, a schematic view, with a portion shown in cross section, of a substrate processing chamber 100, such as an epitaxial growth (epi) chamber, and a movable temperature measurement apparatus are illustrated in accordance with an embodiment. It should be noted that FIG. 1 only illustrates a simplified construction of the substrate processing chamber or epitaxial growth chamber 100 because the inventive aspects of the various embodiments are independent from the structure or the system configuration of the epitaxial growth chamber 100. The epitaxial growth chamber 100 illustrated herein is limited solely for the purpose of clearly illustrating the inventive aspects of the various embodiments. The present invention is not limited to any particular epitaxial growth equipment.

The epitaxial growth chamber 100 comprises an upper dome portion 102 and a lower dome portion 104. The upper dome portion 102 and the lower dome portion 104 are connected to form an inner chamber 105. A susceptor 106, or other type of processing surface, may be positioned within the inner chamber 105 of the epitaxial growth chamber 100 and connected to a rotating shaft 108. The rotating shaft 108 is connected to a drive mechanism (not shown) that is operable to rotate or spin the rotating shaft 108. The rotating shaft 108, thus, causes the susceptor 106 to rotate or spin within the inner chamber 105 during the epitaxial growth process.

Prior to the epitaxial growth process, and as illustrated in FIG. 1, a wafer 110, such as a silicon wafer, will be placed on the susceptor 106. A layer or a film 124, such as an epitaxial film (epi), will be subsequently grown, formed or deposited on top of the wafer 110. The susceptor 106, in some aspects, provides mechanical support for the wafer 110. In yet some aspects, the susceptor 106 helps to protect the backside of the wafer 110 and ensure uniform heating of the wafer 110. The susceptor 106 may be made of non-transparent materials such as silicon carbide, graphite with a silicon carbide coating and/or the like.

A gas supply source 118 that contains a plurality of separately contained gases or precursors for forming the film 124 is connected to the epitaxial growth chamber 100. The gas supply source 118 includes a mixing chamber (not shown) for mixing the precursors. The mixed precursors, as introduced to the inner chamber 105, are represented by arrows 130. The gas supply source 118 is connected to the epitaxial growth chamber 100 via an inlet 126. An outlet 128 is positioned opposite the inlet 126. The mixed precursors 130 flow from the gas supply source 118 into the epitaxial growth chamber 100 via the inlet 126 and any exhaust gases exit the epitaxial growth chamber 100 via the outlet 128. The gas supply source 118 may be controlled by a controller 116, which will be discussed in more detail below. The gas supply source 118 may house various gas delivery components, such as, flow ratio controllers, injection valves, and mass flow verification components. In an illustrative embodiment, the mixed precursors 130 may be comprised of a number of different liquids or gases that when combined form epitaxial silicon, polycrystalline silicon (polysilicon), silicon oxides, silicon nitrides, and other types of silicon-containing films (e.g., Si, SiGe, SiC, or SiGeC, etc) on top of the wafer 110. In one embodiment, the carrier gas may be $N_2$ or $H_2$ at 0.5 to 50 liters. In one embodiment, the process gas may be $SiH_4$, DCS, $B_2H_6$, $PH_3$, HCl, $GeH_4$ or MMS (carbon source).

The epitaxial growth chamber 100 further comprises a variety of heating sources 112. Heat is generally an integral component in the film 124 formation. The mixed precursors 130 may react in the presence of heat to form the film 124 on the wafer 110. If heat is disproportionately applied within the epitaxial growth chamber 100, then the film 124 may be formed on the wafer 110 unevenly. Uneven formation of the film 124 translates into thickness variations across the film 124. In other words, disparities in heat application can cause the film 124 to form unevenly such that different areas of the film 124 will have different thicknesses. Uneven formation of the film 124 and thickness variations within the film 124 are undesirable.

The heating sources 112 may be implemented by using resistance heaters, radio frequency inductive heaters, lamps, lamp banks and the like. In accordance with an embodiment, heating sources 112 may represent a plurality of lamps or lamp banks that are employed to heat elements within the epitaxial growth chamber 100. For example, the heating sources 112 may be employed to heat the susceptor 106, the wafer 110, the mixed precursors 130 or the film 124. Each heating source 112 or lamp bank may be controlled separately from the other heating sources 112 using a controller, for example the controller 116 illustrated in FIG. 3, the process of which will be described in more detail below.

FIG. 1 shows three heating sources 112. However, it will be appreciated by one of skill in the art that there may be fewer than or greater than three heating sources 112. In some embodiments, there may be one, two, three, four, five, six or more heating sources 112. In an illustrative embodiment, the heating sources 112 of the epitaxial growth chamber 100 may be implemented by using two heating sources 112 (or lamp banks), namely an upper heating source 112 positioned above the susceptor 106 and the upper dome portion 102 and a lower heating source 112 positioned below the susceptor 106 and the lower dome portion 104. In yet some embodiments, the heating sources 112 may be positioned only below the susceptor 106 or only above the susceptor 106. A number of heating source 112 configurations is known in the art. Each heating source 112 or lamp bank may be responsible for heating a designated zone or area inside the epitaxial growth chamber 100. Furthermore, designated zones or areas corresponding to each heating source 112 may be separately controllable. Separate control of the heating sources 112 allows different areas or zones to be controlled so that precise control of the film 124 process, i.e. uniform thickness of the film 124, may be better achieved.

The walls of the upper dome portion 102 and the walls of the lower dome portion 104 may be made of transparent materials such as quartz. The light from the heating sources 112 may radiate through the quartz wall of the epitaxial growth chamber 100 and directly heat the wafer 110 and the susceptor 106. As a result, the top side of the wafer 110 is heated by the radiant thermal transfer from the heating sources 112 positioned above the wafer 110. The backside of the wafer 110 is heated by the conduction thermal transfer from the heated susceptor 106, which is heated by the radiant thermal transfer from the heating sources 112 positioned below the susceptor 106.

Figure 2:
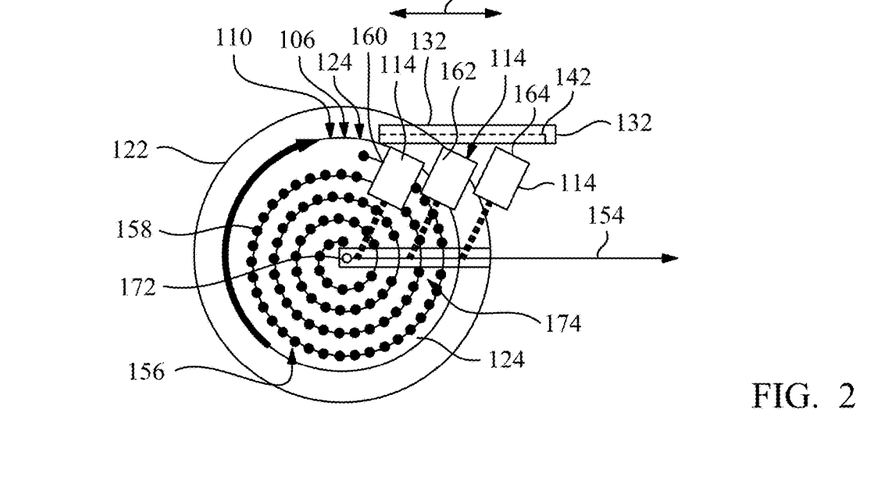
FIG. 2 is a top, schematic view of a substrate processing chamber, illustrating a movable temperature sensor in accordance with some embodiments.

A reflector 122 may optionally be utilized with the epitaxial growth chamber 100, as shown in FIG. 1 and as schematically represented in FIG. 2. The reflector 122 may be used to help reflect infrared light escaping the epitaxial growth chamber 100 back into the epitaxial growth chamber 100. The reflector 122 improves heating efficiency by containing heat that would otherwise escape the epitaxial growth chamber 100. The reflector 122 typically includes a mirrored surface facing the susceptor 106. In an embodiment, the reflector 122 is made of aluminum or stainless steel with metal coating.

In an illustrative embodiment, the reflector 122 is positioned above the upper dome portion 102 of the epitaxial growth chamber 100. A movable temperature sensor, such as a movable temperature sensor 114, may be connected to or otherwise positioned adjacent to the reflector 122. Additional temperature sensors (not shown) may be used in addition to the movable temperatures sensor 114 as is known in the art. The reflector 122 includes a window 174 positioned above a portion of the susceptor 106 to allow the movable temperature sensor 114 to take temperature measurements at various locations within the epitaxial growth chamber 100. FIG. 1 illustrates the window 174 in a cross-sectional view, whereas FIG. 2 shows a schematic representation of the window 174 as it may be positioned relative to the susceptor 106, the wafer 110, etc.

The window 174, in an illustrative embodiment that utilizes the movable temperature sensor 114, may have a rectangular shape, as shown in FIGS. 1 and 2, that facilitates the movable temperature sensor 114 such that the movable temperature sensor 114 is able to take a plurality of temperatures at various positions within the epitaxial growth chamber 100. The movable temperature sensor 114 is operable to take the plurality of temperatures as the susceptor 106 and wafer 110 rotate within the epitaxial growth chamber 100. It should be appreciated, however, that in some embodiments the window 174 may have other shapes that will facilitate temperature measurements by the movable temperature sensor 114.

Still referring to FIGS. 1 and 2, the movable temperature sensor 114 is described in more detail. The movable temperature sensor 114 is employed to monitor the temperature values corresponding to different portions or locations within the epitaxial growth chamber 100. Monitoring the temperature values corresponding to different portions or locations within the epitaxial growth chamber 100, in some embodiments, allows for precise adjustments of the temperatures within the epitaxial growth chamber 100 by the controller 116. Precise adjustments to the temperatures within the epitaxial growth chamber 100 may help facilitate uniform growth and thickness of the film 124 as the film 124 forms on the wafer 110. In an embodiment, the movable temperature sensor 114 is operable to sense temperatures between 200 and 1200 degrees Celsius. In other embodiments, the movable temperature sensor 114 may sense temperatures less than 200 degrees Celsius and greater than 1200 degrees Celsius. The movable temperature sensor 114 is operable to sense temperatures to within 0.1 degrees Celsius. In a non-limiting, illustrative embodiment, the movable temperature sensor 114 is operable to measure temperatures on the wafer 110 between 300 and 700 degrees Celsius. It will be appreciated, however, that temperatures less than 300 degrees Celsius and temperatures greater than 700 degrees Celsius may also be measured on the wafer 110.

In accordance with an embodiment, the movable temperature sensor 114 may be a pyrometer. The movable temperature sensor or pyrometer 114 is placed above the silicon wafer 110 as well as the upper dome portion 102. In some embodiments, the movable pyrometer 114 is positioned above the reflector 122 or otherwise connected to the reflector 122. In some embodiments, however, the movable pyrometer 114 may be placed below the lower dome portion 104. The movable temperature sensor or pyrometer 114, in some aspects, is connected to the epitaxial growth chamber 100. In another aspect, the movable pyrometer 114 is not connected to the epitaxial growth chamber 100 but is otherwise positioned relative to the epitaxial growth chamber such that the movable pyrometer 114 is operable to move relative to the epitaxial growth chamber 100. The movable pyrometer 114 is operable to move relative to the upper dome portion 102, the susceptor 106, the wafer 110, the film 124 or any combination thereof.

Additional temperature sensors (not shown) may be used in addition to the movable temperatures sensor 114 as is known in the art. In some embodiments, the additional sensors may be positioned below the lower dome portion 104, above the upper dome portion 102, or a combination thereof. The temperature sensors, including the movable temperature sensor 114, are operable to monitor the temperature within the epitaxial growth chamber 100. In some embodiments, the wafer 110 temperatures are measured. In other embodiments, the film 124 temperature are measured. In yet some embodiments the temperature is measured on the susceptor 106. And in yet some embodiments, the temperature is measured on the wafer 110, the film 124, the susceptor 106, or any combination thereof.

It should be noted that while FIGS. 1 and 2 show the location of the movable pyrometer 114, the movable pyrometer 114 configuration shown in FIGS. 1 and 2 is merely an example. A person skilled in the art will recognize many variations, alternatives, and modifications.

Referring still to FIGS. 1 and 2, a guide or jig 132 that is operably connected to the movable pyrometer 114 is illustrated. The guide 132 holds the movable pyrometer 114 while simultaneously directing the movement of the movable pyrometer 114. In a non-limiting, illustrative embodiment, the movable pyrometer 114 travels 150 mm in each direction. In some embodiments, the movable pyrometer 114 may travel less than or greater than 150 mm in each direction. In yet some embodiments, the distance the movable pyrometer 114 travels in each direction is dependent on the radius of the susceptor 106, the wafer 110 or the film 124. In other words, the movable pyrometer 114 may travel less than, equal to, or greater than the radius of the susceptor 106, the wafer 110 or the film 124.

The guide 132 is operable to direct the movable pyrometer 114, in some embodiments, with an accuracy of within 1.5 millimeters (mm). As illustrated in FIGS. 1 and 2, the guide 132 is aligned with a radial axis 154 and directs the movable pyrometer 114 along the radial axis 154. The radial axis 154 extends outwardly from a center portion 140 of the susceptor 106 or a center portion 141 of the wafer 110. In an embodiment, the radial axis 154 is stationary such that the radial axis 154 does not move as the susceptor 106 and the wafer 110 are rotated within the epitaxial growth chamber 100.

The movable pyrometer 114 is movably connected to the guide 132, allowing the movable pyrometer 114 to move relative to the epitaxial growth chamber 100 and the components contained within the inner chamber 105 of the epitaxial growth chamber 100. In an embodiment, the guide 132 is fixed in place relative to the epitaxial growth chamber 100. In some embodiments, the guide 132 is fixed in place relative to the epitaxial growth chamber 100 by fixedly attaching the guide 132 to the epitaxial growth chamber 100. As shown in FIG. 1, the guide 132 includes an attachment mechanism 135 that attaches the guide 132 to a portion of the epitaxial growth chamber 100. It will be appreciated by one of ordinary skill in the art that there are multiple ways in which to attach the guide 132 so that the guide 132 is fixed in place relative to the epitaxial growth chamber 100.

In the illustrated embodiment, the guide 132 is positioned above the reflector 122 and, correspondingly, the upper dome portion 102. In other embodiments (not shown), the guide 132 may be positioned below the lower dome portion 104.

The guide 132 includes a first end 134 and a second, opposing end 136. The first end 134 of the guide 132 is proximate an outer portion 138 of the susceptor 106, and the second end 136 is proximate the center portion 140 of the susceptor 106. Likewise, the first end 134 the guide 132 is proximate an outer portion 150 of the wafer 110, and the second end 136 is proximate a center portion 141 of the wafer 110.

The guide 132, in some embodiments, further includes a track or a slot 142 formed in a bottom 148 of the guide 132. The slot 142 receivably holds or is otherwise connected to the movable pyrometer 114, while allowing the movable pyrometer 114 to move within or along the slot 142. In an embodiment, the track or slot 142 comprises components (not shown) that direct the movement of the movable pyrometer 114. The controller 116 may control or cause the movable pyrometer 114 to move within or along the slot 142.

The slot 142 extends between the first end 134 of the guide 132 and the second end 136 of the guide 132. In an embodiment, the slot 142 is aligned with the radial axis 154. The slot 142 has a first end 144 and a second, opposing end 146. The movable pyrometer 114 is operable to move back and forth between the first end 144 and the second end 146 of the slot 142. In an embodiment, the controller 116 determines and controls the position of the movable pyrometer 114 within or along the slot 142. In an embodiment, the position of the movable pyrometer 114 is sent to the controller 116 as part of a feedback network 120, illustrated in FIG. 3.

The first end 144 of the slot 142 is proximate the first end 134 of the guide 132, and the second end 146 of the slot 142 is proximate the second end 136 of the guide 132. In an embodiment, the first end 144 of the slot 142 is proximate to the outer portion 150 of the wafer 110. In yet another embodiment, the first end 144 of the slot 142 is proximate to an outer edge 176 of the susceptor 106. In some embodiments, the first end 144 the slot 142 is distal to the outer portion 150 of the wafer 110 or the outer edge 176 of the susceptor 106.

In an embodiment, the bottom 148 of the guide 132 is substantially parallel to the susceptor 106. In some embodiments, the guide 132 is formed of an alloy steel.

Referring primarily to FIG. 2, but with continued reference to FIG. 1, the movable pyrometer 114 is shown in three illustrative positions as the movable pyrometer 114 moves back and forth according to arrow 168 along the slot 142 of the guide 132. In a first position 160, the movable pyrometer 114 is operable to take temperature readings corresponding to the center portion 141 of the wafer 110. In a second position 162, the movable pyrometer 114 is operable to take temperature readings corresponding to an intermediate portion 137 of the wafer 110. In a third position 164, the movable pyrometer 114 is operable to take temperature readings corresponding to the outer portion 150 of the wafer 110. The first, second, and third positions 160, 162, 164 are merely representations of a number of positions of the movable pyrometer 114 along the slot 142. Moreover, the first, second and third position 160, 162, 164 may correspond to center, intermediate and outer edge portions of the susceptor 106 or the film 124.

In operation, the movable pyrometer 114 moves back and forth along or within the slot 142 and along the radial axis 154. In some embodiments, the movable pyrometer 114 moves back and forth at a speed of 1 to 10 m/s. In one embodiment, the movable pyrometer 114 moves back and forth at a speed of 5 m/s. The movable pyrometer 114 may move back and forth at a speed less than 1 m/s or greater than 10 m/s. As the movable pyrometer 114 moves back and forth, the susceptor 106 and the wafer 110 rotate within the epitaxial growth chamber 100. In some embodiments, the susceptor 106 and the wafer 110 rotate between 1 and 100 rpm. In one embodiment, the susceptor 106 and the wafer 110 rotate at 30 rpm. The susceptor 106 and the wafer 110 may rotate at less than 1 rpm or greater than 100 rpm. Moving the movable pyrometer 114 back and forth between a center 172 or the center portion 141 of the wafer 110 to the outer portion 150 of the wafer 110 while the susceptor 106 and the wafer 110 rotates, allows the movable pyrometer 114 to take temperature measurements along a surface 156 of the wafer 110 or a surface of the film 124. In other words, the movable pyrometer 114 accumulates temperature data points or thermal data 158 across the surface 156 of the wafer 110 or a surface of the film 124 to allow the controller 116 to create a thermal profile of the film 124. In an embodiment, the thermal data 158 includes temperature data as well as positional data corresponding to the temperature data. The thermal data 158 may correspond to temperatures at specific locations on the wafer 110 or film 124.

Figure 4:
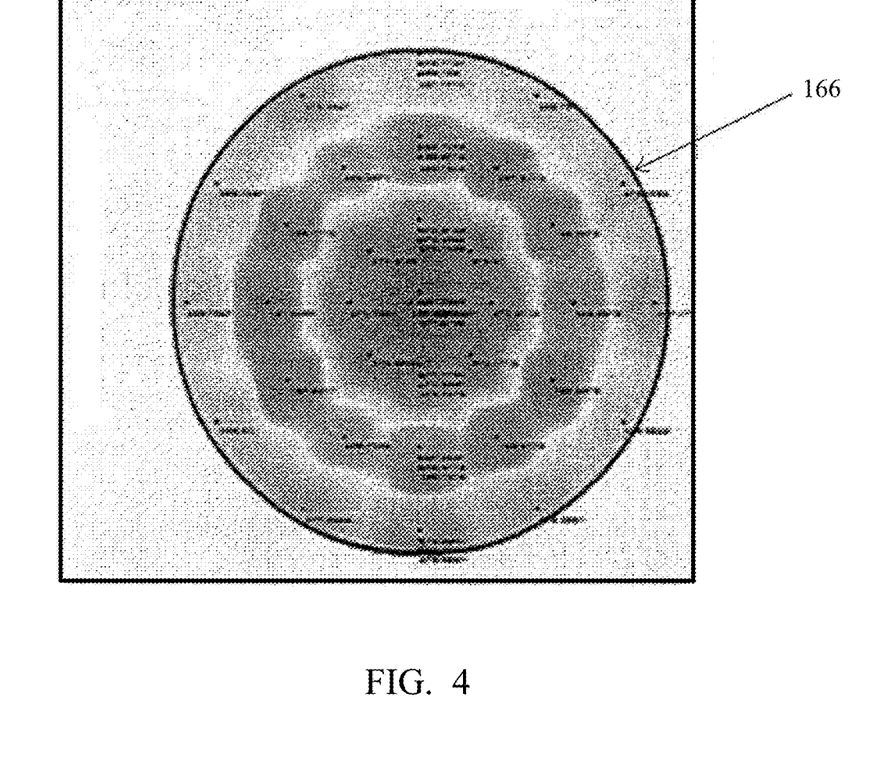
FIG. 4 illustrates a contour thermal distribution map in accordance with some embodiments.

Based, at least in part, on the thermal data 158 received from the movable pyrometer 114, the controller 116 may form a thermal distribution contour or mapping 166 of the film 124, as illustrated in FIG. 4, in real time within the epitaxial growth chamber 100. In other embodiments, the thermal distribution contour 166 may be formed using both the thermal data 158 from the movable pyrometer 114 as well as other data from other sensors, including other temperature sensors. With the movable pyrometer 114 moving back and forth between the center portion 141 of the wafer 110 and the outer portion 150 of the wafer 110 as the susceptor 106 and the wafer 110 rotates, the movable pyrometer 114 may generate greater than 200 times more data per one rotation cycle than if the movable pyrometer 114 was stationary. In some embodiments, the movable pyrometer 114 may collect 10,000 data points (thermal data 158) per second. The thermal distribution contour or mapping 166 may be used to determine a thickness 152 of the film 124 at various positions, i.e., a three dimensional map may be created indicating the thickness of the film 124 at different locations.

Figure 3:
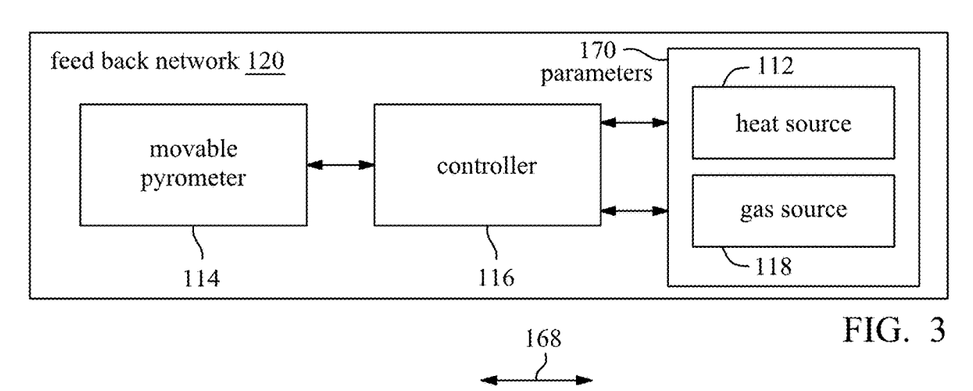
FIG. 3 is a schematic view of a feedback network in accordance with some embodiments.
Figure 5:
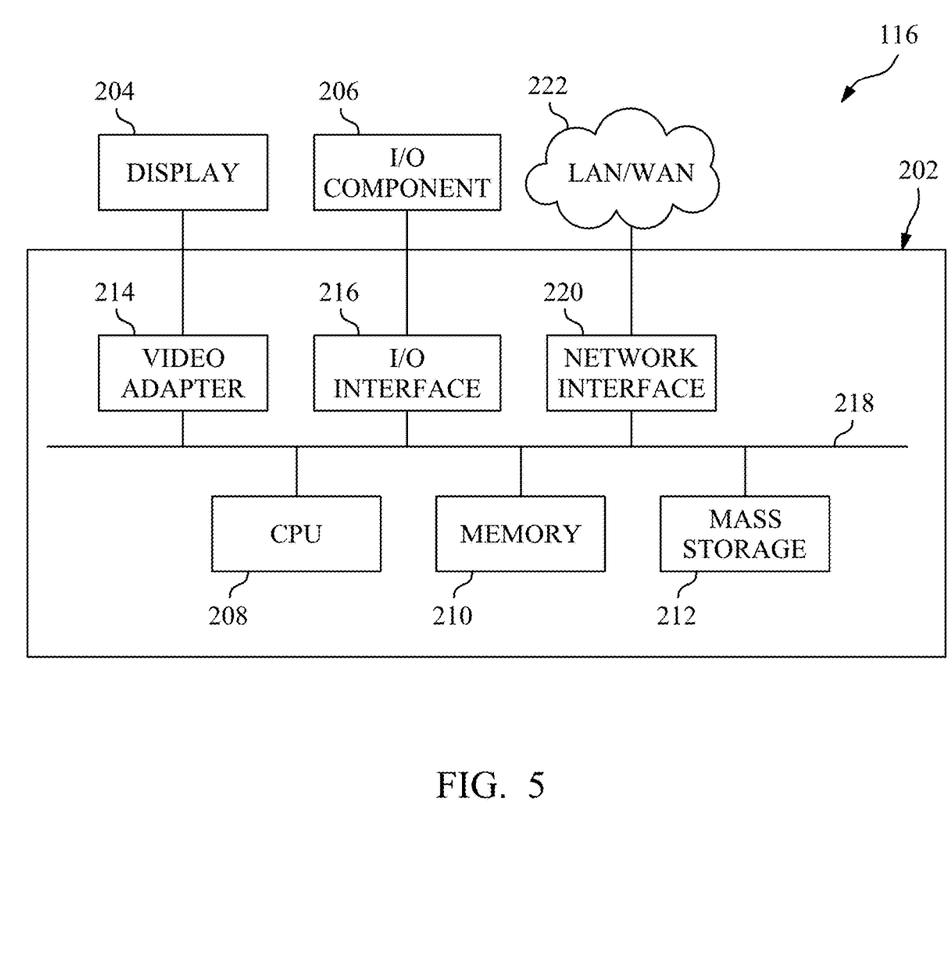
FIG. 5 is a schematic view of a controller in accordance with some embodiments.

Referring now primarily to FIGS. 3 and 5, but with continued reference to FIGS. 1-2 and 4, the controller 116 is described in more detail. In an embodiment, the controller 116 may in real time dynamically adjust a temperature, and, thus, cause the thickness 152 of the film at specific locations on the film 124 to be adjusted to create a uniform thickness throughout the film 124. The controller 116 may do this base on thermal data 158 or the thermal distribution contour 166.

In accordance with an embodiment, the movable pyrometer 114 provides adequate information, for example, the temperatures at a specific location on the wafer 110 or the film 124, for the controller 116 to form a thermal distribution map 166, as illustrated in FIG. 4. In an embodiment, the controller 116 adjusts the temperature distribution, i.e., adjusts the temperature at various locations within the epitaxial growth chamber 100 to help the film 124 form with uniform thickness. In one embodiment, the controller 116 adjusts the temperature at specific locations within the epitaxial growth chamber 100 by changing the power output between each of the heat sources 112, and may further change the power output ratio between the different heat sources 112. In another embodiment, the controller 116 may adjust the temperature distribution by changing the power output of the gas supply source 118 to modify the amount of the precursor 130 being injected into the inner chamber 105 and along the susceptor 106 or wafer 110. In some embodiments, the operational pressure ranges between 1 to 600 torr. In one embodiment, the flow rate may be 10 to 1000 sccm.

The controller 116 may employ the feedback network 120 to determine the temperatures in areas corresponding to a particular heating source 112. Based on the feedback received from the movable pyrometer 114, the heat sources 112, or the gas supply source 118, the controller 116 may adjust parameters 170 to alter the environment inside the epitaxial growth chamber 100. In an illustrative embodiment, the controller 116 may instruct a particular heating source 112 to provide more power as well as radiation energy when the detected temperature value shows the area corresponding to the respective heating source 112 has a temperature that is less than a predetermined set point. Likewise, the controller 116 may instruct a particular heating source 112 to cut its power output as well as radiation energy when the detected temperature value shows the area corresponding to the respective heating source 112 has a temperature greater than a predetermined set point. In an embodiment, the controller 116 is operable to adjust a flow rate of the mixed precursors 130 injected onto the susceptor 106 or the wafer 110.

FIG. 5 illustrates an embodiment of the controller 116 that may be utilized to control the movable pyrometer 114, the heat source 112, and the gas supply source 118 (containing the mixed precursors 130), as illustrated in FIG. 3. The controller 116 may be any form of computer processor that can be used in an industrial setting for controlling process machines or may alternatively be a general purpose computer platform programmed for such control. In an embodiment the controller 116 may comprise a processing unit 202, such as a desktop computer, a workstation, a laptop computer, or a dedicated unit customized for a particular application. The controller 116 may be equipped with a display 204 and one or more input/output (I/O) components 206, such as instruction outputs, sensor inputs, a mouse, a keyboard, printer, combinations of these, or the like. The processing unit 202 may include a central processing unit (CPU) 208, memory 210, a mass storage device 212, a video adapter 214, and an I/O interface 216 connected to a bus 218.

The bus 218 may be one or more of any type of several bus architectures including a memory bus or memory controller, a peripheral bus, or video bus. The CPU 208 may comprise any type of electronic data processor, and the memory 210 may comprise any type of system memory, such as static random access memory (SRAM), dynamic random access memory (DRAM), or read-only memory (ROM). The mass storage device 212 may comprise any type of storage device configured to store data, programs, and other information and to make the data, programs, and other information accessible via the bus 218. The mass storage device 212 may comprise, for example, one or more of a hard disk drive, a magnetic disk drive, or an optical disk drive.

The video adapter 214 and the I/O interface 216 provide interfaces to couple external input and output devices to the processing unit 202. As illustrated in FIG. 5, examples of input and output devices include the display 204 coupled to the video adapter 214 and the I/O component 206, such as a mouse, keyboard, printer, and the like, coupled to the I/O interface 216. Other devices may be coupled to the processing unit 202 and additional or fewer interface cards may be utilized. For example, a serial interface card (not shown) may be used to provide a serial interface for a printer. The processing unit 202 also may include a network interface 220 that may be a wired link to a local area network (LAN) or a wide area network (WAN) 222 and/or a wireless link.

It should be noted that the controller 116 may include other components. For example, the controller 116 may include power supplies, cables, a motherboard, removable storage media, cases, and the like. These other components, although not shown in FIG. 5, are considered part of the controller 116.

In operation, an illustrative process for forming a thermal distribution contour 166 of the film 124 includes the steps of rotating the susceptor 106 for which the film 124 will be formed on, distributing the mixed precursors 130 onto the susceptor 106 to form the film 124, and measuring a plurality of temperatures at a plurality of locations (the thermal data 158 shown in FIG. 2) on the film 124 using the movable pyrometer 114. The movable pyrometer 114 is operable to move along the radial axis 154, which extends approximately between the center portion 141 of the wafer 110 to the outer portion 150 of the wafer 110. The process may further include the controller 116 receiving the plurality of temperatures and determining a thickness variation profile of the film 124.

In operation an illustrative method for dynamically adjusting a thickness of the film 124 and the epitaxial growth chamber 100 is presented. The method includes moving the movable pyrometer 114, which may be positioned adjacent to the epitaxial growth chamber 100, back and forth along the radial axis 154, rotating the susceptor 106 for which the film 124 is being formed on, and measuring a temperature of the wafer 110 or the film 124 at a plurality of locations as the movable pyrometer 114 is moved back and forth along the radial axis 154. The method further includes forming a temperature profile 166 of the film 124 as the film 124 is formed, and based on the temperature profile 166, determining a thickness variation in the film 124 and adjusting a predetermined variable to adjust the thickness of the film 124. In some embodiments, the predetermined variable is increasing a heat from the heat sources 112. In yet some embodiments, the predetermined variable is a flow rate of the mixed precursors 130 used to form the film 124.

The embodiments disclosed herein provide for in-situ, real time, monitoring of film 124 growth uniformity. Based on the measurements of the thickness 152 of the film 124, real time or not, the thickness 152 at specific locations on the wafer 110 or film 124 may be adjusted to create uniform thickness throughout the film 124. Moving the movable pyrometer 114 back and forth along a portion of the wafer 110 allows for dynamic monitoring of the temperatures across the surface 156 of the film 124.

In accordance with an embodiment, a substrate processing chamber, having a processing surface, includes a guide fixed in place relative to the substrate processing chamber and a movable pyrometer connected to the guide. The movable pyrometer is movable along a radial axis that extends approximately between a center of the processing surface and an outer surface of the processing surface. The movable pyrometer is operable to monitor temperatures inside the substrate processing chamber along the radial axis.

In accordance with another embodiment, a process for forming a thermal distribution contour of an epitaxial film growth positioned on a wafer, wherein the epitaxial film growth is formed in an epitaxial film growth chamber, is presented. The process includes the steps of rotating a wafer for which the epitaxial film growth will be formed on, distributing precursors onto the wafer to form the epitaxial film growth, and measuring a plurality of temperatures at a plurality of locations on the wafer using a pyrometer. The pyrometer moves along a radial axis that extends approximately between a center portion of the wafer to an outer edge of the wafer.

In accordance with yet another embodiment, a method for dynamically adjusting a thickness of an epitaxial film growth in an epitaxial film growth chamber is presented. The method includes the steps of moving a pyrometer positioned adjacent to the epitaxial film growth chamber back and forth along a radial axis, rotating a wafer and a processing surface, the wafer positioned on the processing surface, wherein the epitaxial film growth is formed on the wafer, and measuring a temperature of the wafer growth at a plurality of locations as the pyrometer moves back and forth along the radial axis. The method further includes the step of forming a temperature profile of the epitaxial film growth as the epitaxial film growth is formed, and based on the temperature profile, determining thickness variations in the epitaxial film growth and adjusting a predetermined variable to adjust the thickness of the epitaxial film growth.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A process comprising:
   rotating a single wafer in a processing chamber, wherein the processing chamber comprises a susceptor, the single wafer being placed on the susceptor, wherein the processing chamber comprises a dome interior surface positioned above the single wafer and a reflector positioned over the single wafer;
   heating the single wafer using a first heat source and a second heat source, wherein the first heat source and the second heat source are coupled to a controller, wherein the controller independently controls the first heat source and the second heat source;
   distributing precursors onto the single wafer to form an epitaxial film growth on the single wafer;
   measuring a plurality of temperatures at a plurality of first locations on the single wafer using a pyrometer, wherein the plurality of first locations defines a spiral pattern that extends approximately between a center portion to an outer edge of the single wafer, wherein the plurality of temperatures are measured through a window;

providing the plurality of temperatures to the controller, wherein the controller is communicatively coupled to the first heat source, the second heat source, a gas source, and the pyrometer;

determining a thickness variation profile of the epitaxial film growth at a plurality of second locations while the epitaxial film growth is being formed; and adjusting the first heat source, the second heat source, or the gas source based upon the thickness variation profile.

2. The process of claim 1, wherein the pyrometer moves along a radial axis, the radial axis being one dimensional.

3. The process of claim 1, wherein the reflector reflects infrared light.

4. The process of claim 1, wherein the reflector comprises an aluminum or stainless steel.

5. The process of claim 1, wherein heating the single wafer further comprises using a third heat source.

6. The process of claim 5, wherein the third heat source is positioned on the second side of the single wafer.

7. A method comprising:

placing a single wafer in an epitaxial film growth chamber, the epitaxial film growth chamber having an upper dome portion positioned above a first surface of the single wafer, the epitaxial film growth chamber having a reflector positioned above the first surface of the single wafer, the reflector having a window;

adjusting a gas flow rate and a temperature to effect an epitaxial film growth on the first surface of the single wafer, the gas flow rate and the temperature being controlled by a controller, the temperature being adjusted by a plurality of heat sources, wherein the plurality of heat sources comprises a first heat source and a second heat source below the single wafer, wherein the controller controls the first heat source independently from the second heat source;

moving a pyrometer positioned adjacent to the epitaxial film growth chamber along a radial axis, the pyrometer being positioned outside of the epitaxial film growth chamber, wherein the pyrometer detects temperatures of a surface of an epitaxial film growth on the first surface of the single wafer within the epitaxial film growth chamber through the window;

rotating a single wafer, wherein the epitaxial film growth is formed on a first surface of the single wafer, the single wafer being rotated about a central axis of the single wafer;

measuring a temperature of the single wafer at a plurality of locations as the pyrometer moves back and forth along the radial axis, the measuring occurring while the epitaxial film growth is increasing in thickness, the plurality of locations forming a spiral pattern extending approximately from a center portion of the single wafer to an outer edge of the single wafer;

communicating the temperature of the single wafer at a plurality of locations to the controller, wherein the controller forms a temperature profile of the epitaxial film growth as the epitaxial film growth is being formed; and based on the temperature profile, determining thickness variations at different locations in the epitaxial film growth and adjusting the gas flow rate or the temperature to adjust a thickness of the epitaxial film growth at the different locations in the epitaxial film growth.

8. The method of claim 7, wherein adjusting the temperature comprises increasing a temperature of the first heat source.

9. The method of claim 7, wherein adjusting the gas flow rate comprises increasing a flow rate of precursors used to form the epitaxial film growth.

10. The method of claim 7, wherein the plurality of heat sources comprises a third heat source positioned below the single wafer.

11. A method comprising:

placing a wafer on a stage in a processing chamber, wherein the processing chamber is comprises a gas inlet coupling a gas source to the processing chamber, a gas outlet, a dome interior surface above the stage, a reflector above the stage, a plurality of heat sources, and a controller, wherein the controller is configured to individually control the plurality of heat sources and a gas flow rate through the gas inlet, wherein the plurality of heat sources comprises a first heat source and a second heat source below the stage;

rotating the wafer as precursors are distributed into the processing chamber through the gas inlet and as the plurality of heat sources provide heat, thereby forming an epitaxial film growth on a first surface of the wafer on the stage;

as the wafer is being rotated on the stage in the processing chamber:

measuring a first temperature of the wafer at a first location on the wafer using a temperature sensor, the first location being near a center of the wafer;

moving the temperature sensor from the first location on the wafer to a second location on the wafer different than the first location, wherein moving the temperature sensor comprises moving the temperature sensor along a linear line above the wafer as the wafer is rotating in a constant direction;

measuring a second temperature of the wafer at the second location on the wafer using the temperature sensor; and measuring a plurality of additional temperatures of the wafer between measuring the first temperature of the wafer at the first location on the wafer and measuring the second temperature at the second location on the wafer, the plurality of additional temperatures being measured at locations defining a spiral pattern on the wafer, the spiral pattern extending approximately from a center portion to an outer portion of the wafer, the wafer being a single wafer;

determining a thickness profile of the epitaxial film growth based upon the first temperature at the first location, the second temperature at the second location, and the plurality of additional temperatures, the determining being performed while the epitaxial film growth is being formed; and adjusting the gas flow rate through the gas inlet, a temperature of the first heat source, or a temperature of the second heat source while the wafer is being rotated and while the epitaxial film growth is being formed, the adjusting being dependent upon the thickness profile.

12. The method of claim 11, wherein the temperature sensor moves along a radial axis that extends parallel to a line extending from a center portion of the wafer.

13. The method of claim 11, further comprising measuring a temperature using one or more additional temperature sensors.

14. The method of claim 13, wherein the one or more additional temperature sensors are stationary.

15. The method of claim 11, further comprising forming a thermal distribution contour using the first temperature, the second temperature, and the plurality of additional temperatures.

16. The method of claim 11, wherein moving the temperature sensor comprises moving the temperature sensor in a linear manner.

17. The method of claim 16, wherein moving the temperature sensor comprises moving the temperature sensor from measuring an inner portion of the wafer to an outer portion of the wafer.

18. The method of claim 17, wherein moving the temperature sensor comprises moving the temperature sensor from the outer portion of the wafer to the inner portion of the wafer.

19. The method of claim 11 wherein the adjusting is adjusting a temperature of the first heat source.

20. The method of claim 11 wherein the adjusting is adjusting the gas flow rate of at least one precursor.

21. The method of claim 11, wherein the adjusting is adjusting a temperature of the second heat source and the gas flow rate.

* * * * *